United States Patent
Chen et al.

(10) Patent No.: US 6,630,695 B2
(45) Date of Patent: *Oct. 7, 2003

(54) INGAN/ALGAN/GAN MULTILAYER BUFFER FOR GROWTH OF GAN ON SAPPHIRE

(76) Inventors: Changhua Chen, 4685 Albany Cr., #102, San Jose, CA (US) 95129; James Dong, 429 Middlebury Ct., Claremont, CA (US) 91711; Heng Liu, 479 Rosemary St., Arcadia, CA (US) 91007

( * ) Notice: Subject to any disclaimer, the term of this patent is extended or adjusted under 35 U.S.C. 154(b) by 0 days.

This patent is subject to a terminal disclaimer.

(21) Appl. No.: 10/191,886

(22) Filed: Jul. 8, 2002

(65) Prior Publication Data

US 2002/0175337 A1 Nov. 28, 2002

Related U.S. Application Data

(63) Continuation of application No. 09/626,442, filed on Jul. 26, 2000, now Pat. No. 6,495,867.

(51) Int. Cl.[7] ............................................... H01L 33/00
(52) U.S. Cl. ........................................ 257/190; 257/103
(58) Field of Search .............................. 257/94, 96, 97, 257/103, 190, 191, 613, 615

(56) References Cited

U.S. PATENT DOCUMENTS

| 5,929,466 A | 7/1999 | Ohba et al. |
| 6,147,364 A | 11/2000 | Itaya et al. |
| 6,172,382 B1 * | 1/2001 | Nagahama et al. ........... 257/94 |
| 6,233,265 B1 | 5/2001 | Bour et al. |
| 6,285,698 B1 * | 9/2001 | Romano et al. .............. 372/46 |

FOREIGN PATENT DOCUMENTS

JP 11-145063 5/1999

\* cited by examiner

Primary Examiner—Bradley William Baumeister
(74) Attorney, Agent, or Firm—Jean C. Edwards; Sonnenschein Nath & Rosenthal LLP

(57) ABSTRACT

A GaN based three layer buffer structure disposed on a substrate, and having a GaN layer disposed on the three layer buffer structure, the GaN layer serving as a platform for growth of a light emitting structure thereon.

10 Claims, 1 Drawing Sheet

INGAN/ALGAN/GAN MULTILAYER BUFFER FOR GROWTH OF GAN ON SAPPHIRE

This is a continuation of application Ser. No. 09/626,442 filed Jul. 26, 2000, now U.S. Pat. No. 6,495,867.

TECHNICAL FIELD

This invention relates to GaN compound Light Emitting Diodes.

BACKGROUND OF THE INVENTION

A semiconductor light-emitting diode (LED) comprises: a substrate; a light emitting structure; and a pair of electrodes for powering the diode. The substrate may be opaque or transparent. Light Emitting Diodes which are based on Gallium Nitride compounds generally comprise: a transparent, insulating substrate, e.g. a sapphire substrate. Because of the substantial lattice mismatch between an insulating substrate, e.g., a sapphire substrate, and GaN compounds, it is common practice to provide a thin buffer or nucleation layer on the sapphire which is followed by a layer on which an LED structure is grown. Growth of single crystals on insulating substrates has been studied for over 30 years. Early work included growth of both silicon and III–V compounds on a variety of insulating substrates including sapphire and spinel. In these studies it was determined that use of nucleation or buffer layers reduces the occurrences of imperfections and the tendency towards twinning in the thicker layers grown thereon.

DISCLOSURE OF THE INVENTION

In accordance with one aspect of our present invention, we provide a new and novel structure for overcoming the mismatch of the lattices of a sapphire substrate and the nitride layers that follow. We provide three buffer layers on which we grow a high quality I Gallium Nitride layer as a substrate for growth of the light structure. Our first buffer layer is formed of Indium Gallium Nitride. The addition of Indium to the GaN compound provides a soft material with a superior surface diffusion coefficient. These factors facilitate the formation of high quality materials at the beginning of crystal growth. Since InGaN has a larger lattice constant than the target GaN, our second layer is formed of AlGaN to migrate to the lattice constant of GaN. The final buffer layer is formed of GaN to provide a template for the growth of our high quality I GaN layer which serves as a platform for growth of our light emitting structure 12.

DETAILED DESCRIPTION

Figure 1A:
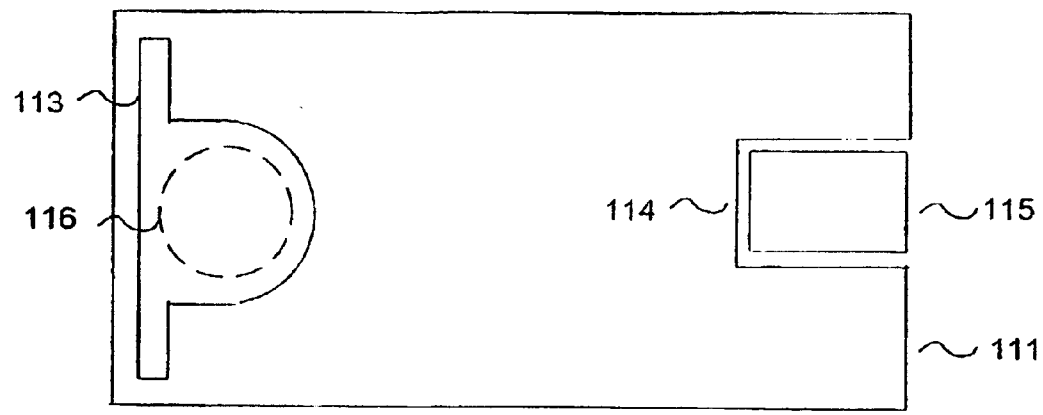
FIGS. 1a and 1b are schematic showings of the top and side views of an illustrative embodiment of our improved LED.
Figure 1B:
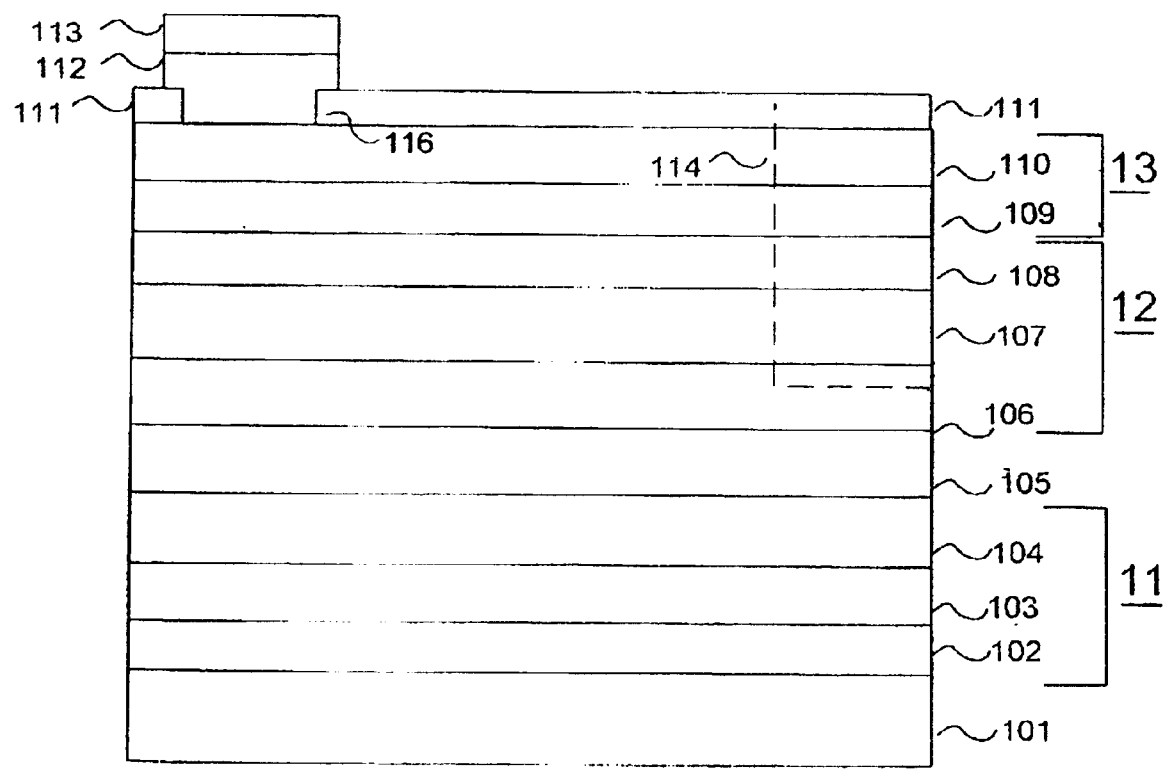

FIGS. 1a and 1b are not drawn to scale.

The illustrative LED of FIGS. 1a and 1b is a GaN based device. The structure of FIGS. 1a and 1b comprises sapphire substrate 101; buffer structure 11; GaN substitute substrate layer 105; light emitting structure 12; window layers 13; semi transparent conductive layer 111; bond pad adhesion layer 112; P electrode bond pad 113; and N electrode bond pad 115 which is not shown in FIG. 1b.

Layers 102 through 110 are grown in a Metal Organic Chemical Vapor Deposition MOCVD reactor. The details of MOCVD growth of the stated layers are well known in the industry and will not be discussed herein except details of the growth process which are particularly relevant to our success.

The remaining components of our improved LED, namely, semi transparent layer 111, adhesion pad 112, P bond pad 113, and N bond pad 115 are formed by evaporation in apparatus other than a MOCVD reactor.

Buffer 11 Between Sapphire Substrate 101 and GaN Layer 105

In the illustrative embodiment of our improved GaN based LED, the 0001 face of sapphire substrate 101 is exposed for growth of our first buffer layer 102. Layer 102 is formed of InGaN to a thickness of approximately 8 nm. The range of Indium in the layer is 1 to 10%. As explained earlier herein, the addition of Indium to the GaN compound provides a soft material with a superior surface diffusion coefficient. These factors facilitate the formation of high quality materials at the beginning of crystal growth.

Since InGaN has a larger lattice constant than that of the target GaN layer 105, our second buffer layer 103 is formed of AlGaN. to migrate to the lattice constant of GaN. The range of Aluminum in the compound of layer 103 ranges from 10 to 100%. Layer 103 is formed to a thickness of approximately 8 nm.

The final buffer layer 104 which is formed of GaN provides a template for the growth of our high quality I GaN layer 105. Layer 104 is formed to a thickness of approximately 8 nm.

GaN layer 105 serves as a platform for growth of our light emitting structure 12. Layer 105 is grown to a nominal thickness of 1 um.

Light Emitting Structure

In the illustrative embodiment of FIG. 1a, light emitting structure 12 comprises N cladding layer 106, active region 107, and P cladding layer 108. Other forms of light emitting structures, e.g., single heterojunction, quantum well, etc. may be equally well used with our invention.

Window Structure

The first window layer 109 is formed of GaN doped with Mg, and has a nominal thickness of 300 nm. The second window layer 110 is similarly formed of Mg doped GaN. However, layer 110 is more highly doped Mg+ to provide an ohmic contact between the layer and the Ni/Au layer 111.

The invention has been described with particular attention to its preferred embodiment; however, it should be understood that variations and modifications within the spirit and scope of the invention may occur to those skilled in the art to which the invention pertains.

What is claimed is:

1. A GaN compound semiconductor structure comprising:
   an insulating substrate;
   a GaN layer;
   a buffer structure situated between the insulating substrate and the GaN layer, the buffer structure comprising:
      a first nucleation layer formed of InGaN, the first nucleation layer disposed on a face of said insulating substrate;
      a second nucleation layer formed of AlGaN, the second nucleation disposed on said first nucleation layer opposite said insulating substrate; and a third nucleation layer formed of GaN, the third nucleation layer disposed on said second nucleation layer opposite said first nucleation layer, the third nucleation layer in contact with said GaN layer; and a light emitting structure disposed on said GaN layer.

2. A buffer structure in accordance with claim 1, wherein:
said insulating substrate is sapphire; and wherein the face of said insulating substrate is an 0001 plane.

3. A buffer structure in accordance with claim 1, wherein:
the content of Indium in said first nucleation layer is in the order of 1 to 10%.

4. A buffer structure in accordance with claim 1, wherein:
the content of Al in said second nucleation layer is in the order of 10 to 100%.

5. A buffer structure in accordance with claim 1, wherein:
said first, second and third nucleation layers are each grown to a thickness of approximately 8 nm.

6. A GaN compound semiconductor structure comprising:
a substrate having a surface;
a GaN layer having a surface; and
a buffer structure situated between the substrate and the GaN layer, the buffer structure including:
 (a) a first nucleation layer in contact with the surface of the substrate, the first nucleation layer formed of InGaN;
 (b) a second nucleation layer in contact with the first nucleation opposite the substrate surface, the second nucleation layer formed of AlGaN; and
 (c) a third nucleation layer in contact with the second nucleation layer opposite the first nucleation layer and in contact with the GaN layer surface, the third nucleation layer formed of GaN; and
a light emitting structure disposed on said GaN layer.

7. A GaN compound semiconductor structure in accordance with claim 6, wherein:
said substrate is sapphire; and wherein the surface of said substrate is an 0001 plane.

8. A GaN compound semiconductor structure in accordance with claim 6, wherein:
the content of Indium in said first nucleation layer is in the order of 1 to 10%.

9. A GaN compound semiconductor structure in accordance with claim 6, wherein:
the content of Al in said second nucleation layer is in the order of 10 to 100%.

10. A GaN compound semiconductor structure in accordance with claim 6, wherein:
said first, second and third nucleation layers are each grown to a thickness of approximately 8 nm.

* * * * *